US010110225B1

(12) United States Patent
Lau et al.

(10) Patent No.: US 10,110,225 B1
(45) Date of Patent: Oct. 23, 2018

(54) INTEGRATED CIRCUIT WITH AN INCREASED SIGNAL BANDWIDTH INPUT/OUTPUT (I/O) CIRCUIT (71) Applicant: Intel Corporation, Santa Clara, CA (US)

(72) Inventors: Ker Yon Lau, Pearl Island (MY); Tat Hin Tan, Bayan Lepas (MY); Choong Kit Wong, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/341,423

(22) Filed: Nov. 2, 2016

(51) Int. Cl.
H03K 19/00 (2006.01)
H03K 17/56 (2006.01)

(52) U.S. Cl.
CPC ......... H03K 19/0005 (2013.01); H03K 17/56 (2013.01)

(58) Field of Classification Search
None
See application file for complete search history.

(56) References Cited

U.S. PATENT DOCUMENTS

| 7,323,900 | B2 | 1/2008 | Kim | |
|---|---|---|---|---|
| 7,710,144 | B2 | 5/2010 | Dreps et al. | |
| 8,089,813 | B2 | 1/2012 | Dreps | |
| 2004/0201401 | A1* | 10/2004 | Morris | H04L 25/0278 326/30 |
| 2005/0122130 | A1* | 6/2005 | Kiehl | H04L 25/0298 326/30 |
| 2009/0224796 | A1* | 9/2009 | Heath | G06F 13/4086 326/30 |
| 2011/0133780 | A1 | 6/2011 | Shau | |

* cited by examiner

Primary Examiner — Jany Richardson (57) ABSTRACT

An input/output (I/O) circuit for an integrated circuit includes an input-output terminal, a termination circuit and an impedance compensation circuit. The termination circuit includes a node that is coupled to the input-output terminal. The termination circuit exhibits substantially constant first impedance below a first frequency of signals received at the input-output terminal. Furthermore, the termination circuit exhibits second impedance that is less than the first impedance when signals having a second frequency that is higher than the first frequency are received at the input-output terminal. The impedance compensation circuit is coupled to the input-output terminal. The impedance compensation circuit compensates for differences between the first and second impendences when the signal having the second frequency that is higher than the first frequency is received at the input-output terminal.

15 Claims, 6 Drawing Sheets

INTEGRATED CIRCUIT WITH AN INCREASED SIGNAL BANDWIDTH INPUT/OUTPUT (I/O) CIRCUIT

BACKGROUND

An integrated circuit generally includes multiple input/output (I/O) circuits. Each of these I/O circuits may be used to transfer signals to the integrated circuit from external circuitry or from the integrated circuit to external circuitry. A termination circuit, which is generally formed as part of each of these I/O circuits, provides termination impedances to incoming signals from external interconnections. A termination circuit with the proper termination impedances may reduce signal losses by way of signal reflections.

An I/O circuit with a termination circuit, however, may be bandwidth-limited and may consequently only be able to send and/or receive signals up to a certain frequency before the transmissions are distorted. Any signals transmitted through termination circuitry having frequencies outside of the frequency range of the termination circuitry may be subject to distortion. The signals may be distorted due to termination impedances provided by the termination circuit varying as a function of the frequency of the signals transmitted through the termination circuit.

Specifically, the termination impedances provided by the termination circuit may be substantially constant for signals below a particular threshold frequency but variable for signals above the particular threshold frequency. As an example, the termination impedances of the termination circuitry can decrease linearly with increasing frequency of the signals transmitted through the termination circuitry.

Therefore, such distortions limit I/O circuits with termination circuitry from being used in applications in which signals are transmitted using high frequency protocols, such as double data rate 3 (DDR3) and double data rate 4 (DD4) signal protocols. Conventional I/O circuits are also limited in the transistor technologies/processes used to implement the termination circuitry. As an example, fin field effect transistor (FinFET) structures as part of the termination circuit may cause a further undesired drop in termination impedances due to the larger gate-source and/or gate-drain capacitances of FinFET transistors relative to conventional planar transistors. These increased capacitances associated with FinFET transistors may exacerbate the high frequency distortion of transmitted signals due to impedance variations, and can also further limit the usable bandwidth of frequencies that the I/O circuits and termination circuitry can be used to transmit.

It would therefore be desirable to implement termination circuitry in I/O circuits that can be designed with various transistor technologies and that have an improved and increased usable signal transmission bandwidth.

SUMMARY

Embodiments described herein include an integrated circuit with a large signal bandwidth input/output (IO) circuit. It should be appreciated that the embodiments can be implemented in numerous ways, such as a process, an apparatus, a system, a device, or a method. Several embodiments are described below.

In one embodiment, an input/output (I/O) circuit for an integrated circuit includes an input-output terminal, a termination circuit and an impedance compensation circuit. The termination circuit includes a node that is coupled to the input-output terminal. The termination circuit exhibits substantially constant first impedance below a first frequency of signals received at the input-output terminal. Furthermore, the termination circuit exhibits second impedance that is less than the first impedance when signals having a second frequency that is higher than the first frequency are received at the input-output terminal. The impedance compensation circuit is coupled to the input-output terminal. The impedance compensation circuit compensates differences between the first and second impendences when the signal having the second frequency that is higher than the first frequency is received at the input-output terminal.

In another embodiment, an integrated circuit device includes multiple input/output (I/O) circuits. Each of these I/O circuits includes a termination circuit and an impedance compensation circuit. The termination circuit provides a substantially constant first impedance within a first signal bandwidth and a second impedance outside of the first signal bandwidth for the I/O circuit. The impedance compensation circuit is coupled to the termination circuit. The impedance compensation circuit provides a third impedance that is utilized to increase a signal bandwidth for the I/O circuit from the first signal bandwidth to a second signal bandwidth.

In another embodiment, an input/output (I/O) circuit includes an input-output terminal, a termination circuit and an impedance compensation circuit. The termination circuit includes a node that is coupled to the input-output terminal. The termination circuit passes an electrical current that varies exponentially negative with increasing voltage of the signals received at the input-output terminal. The impedance compensation circuit is coupled to the node of the termination circuit. The impedance compensation circuit transmits an electrical current that varies exponentially positive with the increasing voltage of the signals at the input-output terminal.

Further features of the invention, its nature and various advantages will be more apparent from the accompanying drawings and the following detailed description of the preferred embodiments.

DETAILED DESCRIPTION

The following embodiments include an integrated circuit with a large signal bandwidth input/output (IC) circuit. It will be obvious, to one skilled in the art, that the present exemplary embodiments may be practiced without some or all of these specific details. In other instances, well-known operations have not been described in detail in order not to unnecessarily obscure the present embodiments.

Throughout this specification, when an element is referred to as being "connected" or "coupled" to another element, it may be directly connected or coupled to the other element or electrically connected or coupled to the other element with yet another element interposed between them.

Figure 1:
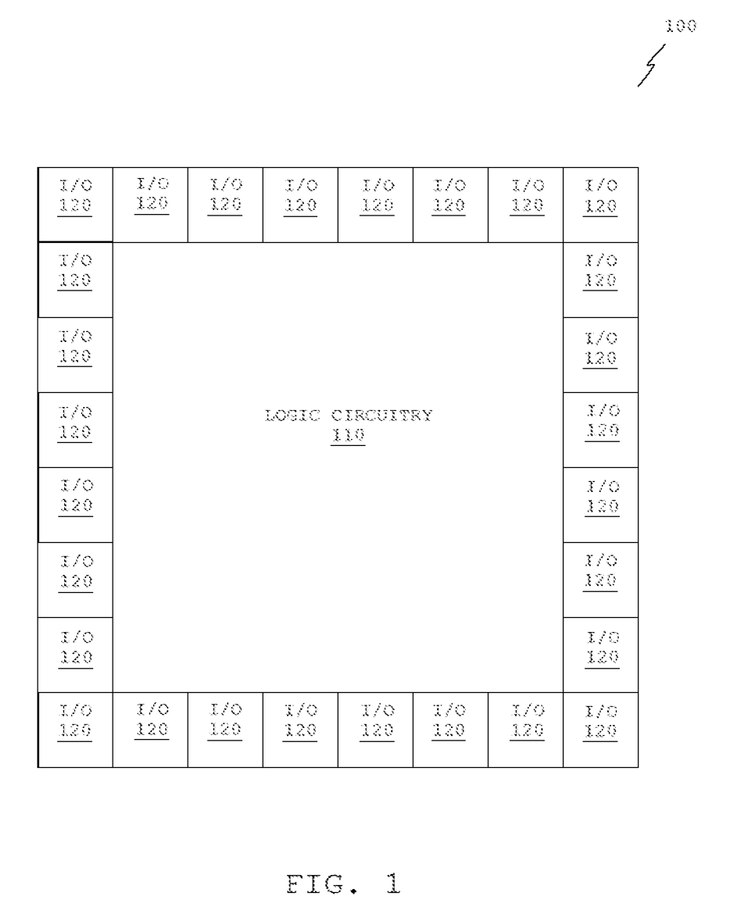
FIG. 1 shows an illustrative integrated circuit (IC) device in accordance with one embodiment of present invention.

FIG. 1, meant to be illustrative and not limiting, illustrates an integrated circuit (IC) device in accordance with one embodiment of present invention. Integrated circuit device 100 includes logic circuitry 110 and multiple input/output (IC) circuits 120.

In one embodiment, integrated circuit device 100 may be an application specific integrated circuit (ASIC) device, an application standard specific product (ASSP) device, a programmable logic device (PLD) or a microprocessor device. In general, the ASIC, ASSP and microprocessor devices may perform fixed and dedicated functions. The PLD devices may be programmable to perform a variety of functions. An example of a PLD device may be a field programmable gate array (FPGA) device. Microprocessor devices, coupled together with other devices (e.g., a memory device), may be utilized to perform instructions provided within a programming code.

Integrated circuit device 100 may be used in different types of high speed systems, for example a communication system such as wireless systems, wired systems, etc. In one embodiment, integrated circuit device 100 may be a PLD utilized for controlling data transfer between different devices, for example, a microprocessor device and/or a memory device. In addition to that, integrated circuit device 100 may include circuits to allow integrated circuit device 100 to communicate with external devices such as memory devices (not shown). Each of these circuits may be defined according to a signal protocol.

Referring still to FIG. 1, I/O circuits 120 occupies the peripheral portion of integrated circuit device 100, whereas logic circuitry 110 occupies the center region of integrated circuit device 100. It should be appreciated that the arrangement of I/O circuits 120 and logic circuitry 110 on integrated circuit device 100 may vary depending on the requirements of a particular device.

In one embodiment, logic circuitry 110 may perform core functions of integrated circuit device 100. Logic circuitry 110 may include specific circuitry for the functions that defines integrated circuit device 100. For example, logic circuitry 110 may include circuits that perform memory device addressing and processing of information retrieved from the memory device when integrated circuit device 100 is a memory controller. In another example, logic circuitry 110 may include programmable logic elements when the integrated circuit device is a PLD. The programmable logic elements may further include circuits such as look-up table (LUT) circuitry, multiplexers, product-term logic, registers, memory circuits and the like. The programmable logic elements may be programmed by a user (e.g., a designer or an engineer) to perform desired functions.

I/O circuits 120 may be utilized for transferring signals into or out of integrated circuit device 100. For example, signals from logic circuitry 110 may be transferred out of integrated circuit device 100 through one of these I/O circuits 120. Additionally, signals received from an external device (external to integrated circuit device 100) may be transferred to logic circuitry 110 through one of these I/O circuits 120. In one embodiment, I/O circuits 120 may be considered as external interfacing circuitry of integrated circuit device 100. Signals may be transferred out or received by one of these I/O circuits 120 through its respective I/O pads (not shown).

Furthermore, I/O circuit 120 may be configurable to a particular standard signal protocol selected in accordance to the external signal interface. In one exemplary embodiment, I/O circuits 120 may be configured to transfer signals in accordance to a double data rate (DDR) protocol, a double data rate 2 (DDR2) protocol, a double data rate 3 (DDR3) protocol or a double data rate 4 (DDR4) protocol. I/O circuit 120 may be configured to any one of these DDR protocols when integrated circuit device 100 is coupled to appropriate synchronous dynamic random access memory (SDRAM) devices, in one embodiment.

It should be appreciated that I/O circuits 120 may be configured through user inputs. In one embodiment, the user may input these user inputs through configuration software (e.g., Quartus® II of Altera® Corporation). Through these user inputs, the user may configure I/O circuits 120 and enable integrated circuit device 100 to communicate externally using different signal protocols.

Each I/O circuit 120 may include additional circuits (not shown). In one exemplary embodiment, the additional circuit may include a termination circuit and an impedance compensation circuit. These circuits may match input impedances of the I/O pad with impedances of an external transmission line. In one embodiment, the input impedances of the I/O pad and the transmission line may be 50 Ohms.

It should be appreciated that the input impedances are matched in order to reduce loses as a result of signal reflections (RL). A low signal return loss means large portions of the incoming signals from an external transmission line may be transmitted (i.e., not much of reflection) in to I/O circuit 120. In contrast, a high signal return loss means only small portions of the incoming signals from the external transmission line may be transmitted (i.e., a high reflection) in to I/O circuit 120.

I/O circuits 120 may have input impedances that are at a relatively constant value up to a certain frequency. This frequency may be also referred to as a cutoff frequency. It should be appreciated that the cutoff frequency may also be the signal bandwidth for I/O circuit 120. For example, I/O circuit 120 having a cutoff frequency of 1.6 gigahertz (GHz) may have a signal bandwidth of 1.6 GHz.

Furthermore, I/O circuits 120 may also have a relatively low I/O pad capacitances. In one embodiment, I/O circuit 120 may satisfy requirements set by the Joint Electron Device Engineering Council (JEDEC). For example, I/O pad capacitance for each I/O circuit 120 may be less than 2.3 picofarad (pF) when integrated circuit device 100 is coupled to a DDR3 SDRAM device. In another exemplary embodiment, I/O pad capacitance for each I/O circuit 120 may be less than 1.7 pF when integrated circuit device 100 is coupled to a DDR4 SDRAM device.

Figure 2:
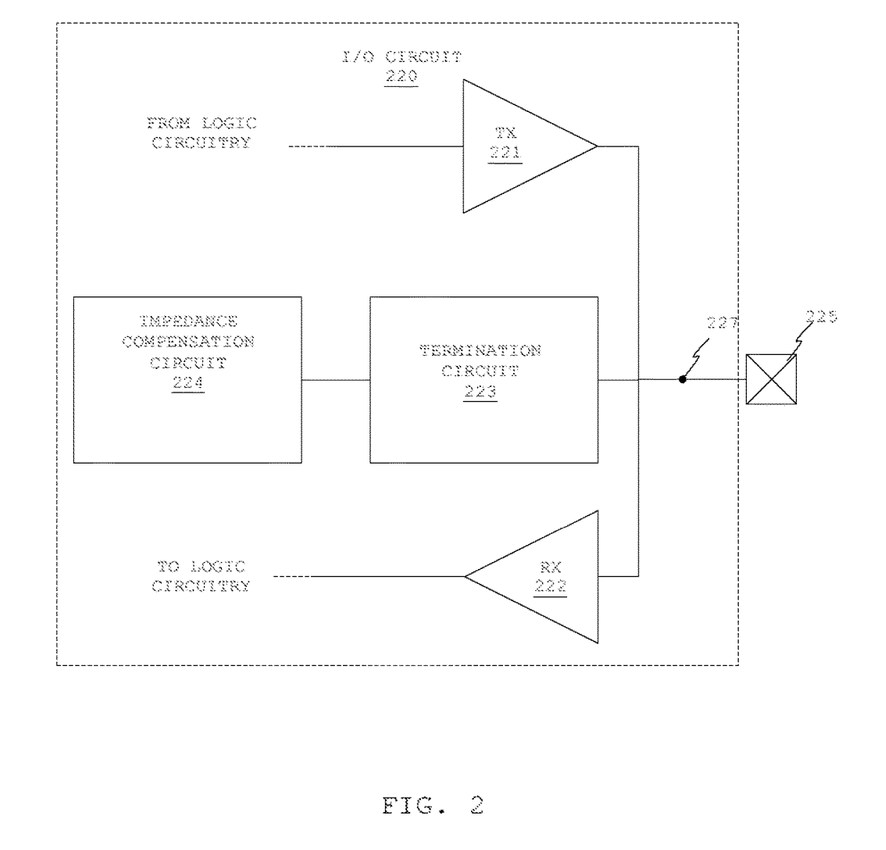
FIG. 2 shows an illustrative I/O circuit in accordance with one embodiment of the present invention.

FIG. 2, meant to be illustrative and not limiting, illustrates an I/O circuit in accordance with one embodiment of the present invention. A similar configuration as shown by I/O circuit 220 may be formed in each of the I/O circuits (e.g., I/O circuits 120 of FIG. 1) of an integrated circuit device (e.g., integrated circuit device 100 of FIG. 1). In one embodiment, I/O circuit 220 may also be referred to as a slice of an I/O circuit within the integrated circuit device. Similar to each of the I/O circuits 120 of FIG. 1, I/O circuit 220 may be utilized to receive a signal from an external transmission line or to transmit a signal from internal circuitry (e.g., logic circuitry 110 of FIG. 1) to the external transmission line.

As shown in the embodiment of FIG. 2, I/O circuit 220 may include node 227, transmitter (Tx) driver circuit 221, receiver (Rx) driver circuit 222, termination circuit 223 and impedance compensation circuit 224. It should be appreciated that I/O circuit 220 may include other circuitries that are not described in here.

Referring still to FIG. 2, node 227 may be coupled to input-output terminal 225, an output terminal of Tx driver circuit 221, an input terminal of Rx driver circuit 222 and termination circuit 223. Termination circuit 223 may further be coupled to impedance compensation circuit 224. An output terminal of Rx driver circuit 222 and an input terminal of Tx driver circuit 221 may be coupled to the logic circuitry (e.g., logic circuitry 110 of FIG. 1).

Termination circuit 223 may provide substantially constant input impedances on node 227 and/or input-output terminal 225 when incoming signals is having frequencies below a certain frequency (i.e., frequency f1). In one embodiment, the substantially constant impedance value may be 50 Ohms and the frequency f1 may be approximately 600 Megahertz (MHz). Termination circuit 223 may provide input impedances that drop linearly as the incoming signals frequencies increases when the incoming signal's frequency is greater than the frequency f1.

As a result of such behavior, termination circuit 223 may have a limited bandwidth. In one embodiment, the bandwidth (BW1) may be similar to the frequency f1 (i.e., 600 MHz) given that the cutoff frequency is based on the frequency f1. It should be appreciated that such a small bandwidth BW1 may only be sufficient to receive signals that are based on a double data rate (DDR) synchronous dynamic random access memory (SDRAM) transmission protocol and/or a double data rate 2 (DDR2) SDRAM transmission protocol. Such bandwidth BW1 may not be able to support receiving signals that based on a double data rate 3 (DDR3) SDRAM transmission protocol and a double data rate 4 (DDR4) SDRAM transmission protocol, as these signal protocols generally requires cutoff frequency/bandwidth that is greater than 600 MHz.

Referring still to FIG. 2, impedance compensation circuit 224 may compensate a drop in the input impedances at node 227 and/or input-output terminal 225. In one embodiment, impedance compensation circuit 224 may compensate differences in input impedances between the constant input impedances and input impedances that linearly drop as the incoming signal frequencies increases. In one embodiment, the compensation by impedance compensation circuit 224 may only occur between the frequency f1 and another frequency, f2. The frequency f2 may be larger than the frequency f1. In one embodiment, the frequency value f2 may be approximately 1.6 GHz.

Impedance compensation circuit 224 may compensate differences in input impedances between the constant input impedances and input impedances that linearly drop as the incoming signal frequencies increases by providing additional impedances. For example, impedance compensation circuit 224 may provide electrically disconnected paths to resistors when receiving signals of frequencies less than the frequency f1. However, impedance compensation circuit 224 may provide electrically connected paths to the resistors when receiving signals at frequencies more than the frequency f1 but less than the frequency f2. Therefore, impedance compensation circuit 224, by electrically connecting and disconnecting paths to the resistors, may compensate the drop in the input impedance and as such enable I/O circuit 220 to have constant input impedances up to frequency f2.

Furthermore, impedance compensation circuit 224 may also increase signal bandwidth for I/O circuit 220 from a bandwidth BW1 (which corresponds to the cutoff frequency of f1) to a bandwidth BW2 (which corresponds to a cutoff frequency of f2) as result the abovementioned compensation. Therefore, I/O circuit 220 may be able to receive signals that are in accordance to a DDR SDRAM, DDR2 SDRAM, DDR3 SRAM and DDR4 SRAM transmission protocols.

Referring still to FIG. 2, signals may be transmitted out of I/O circuit 220 through input-output terminal 225 when I/O circuit is in transmitter mode. Termination circuit 223 may be configured to provide output impedances of 50 Ohms on input-output terminal 225. In one embodiment, termination circuit 223 may provide such impedances by serially coupling transistors between a voltage terminal and a ground terminal. Each of the transistors individually may have impedances of 100 Ohm. As the output impedances on input-output terminal 225 matches impendences on a transmission line (which may be coupled to input-output terminal 225), the signals may be transmitted out of I/O circuit 220 seamlessly (i.e., a low/non-existent signal return loss (RL))

Signals may also be received by I/O circuit 220 through input-output terminal 225 when I/O circuit 220 is in receiver mode. When the signals received at input-output terminal 225 are of low frequencies (e.g., less than frequency f1), termination circuit 223 may provide a constant input impedances (e.g., at 50 Ohms) whereas impedance compensation circuit 224 may be electrically disconnected. Therefore, the signal may be received by I/O circuit 220 seamlessly (i.e., a low/non-existent signal RL).

When the signals received at input-output terminal 225 are of high frequencies (e.g., greater than frequency f1), termination circuit 223 may provide input impedances that is lower than above mentioned constant input impedances. However, impedance compensation circuit 224 may compensate the drop in input impedances by electrically connecting paths to the additional resistors and therefore compensating the amount of drop in the input impedances. As a result of such compensation, the incoming signals of higher frequencies may also be received by I/O circuit 220 seamlessly (i.e., a low/non-existent signal RL).

Figure 3:
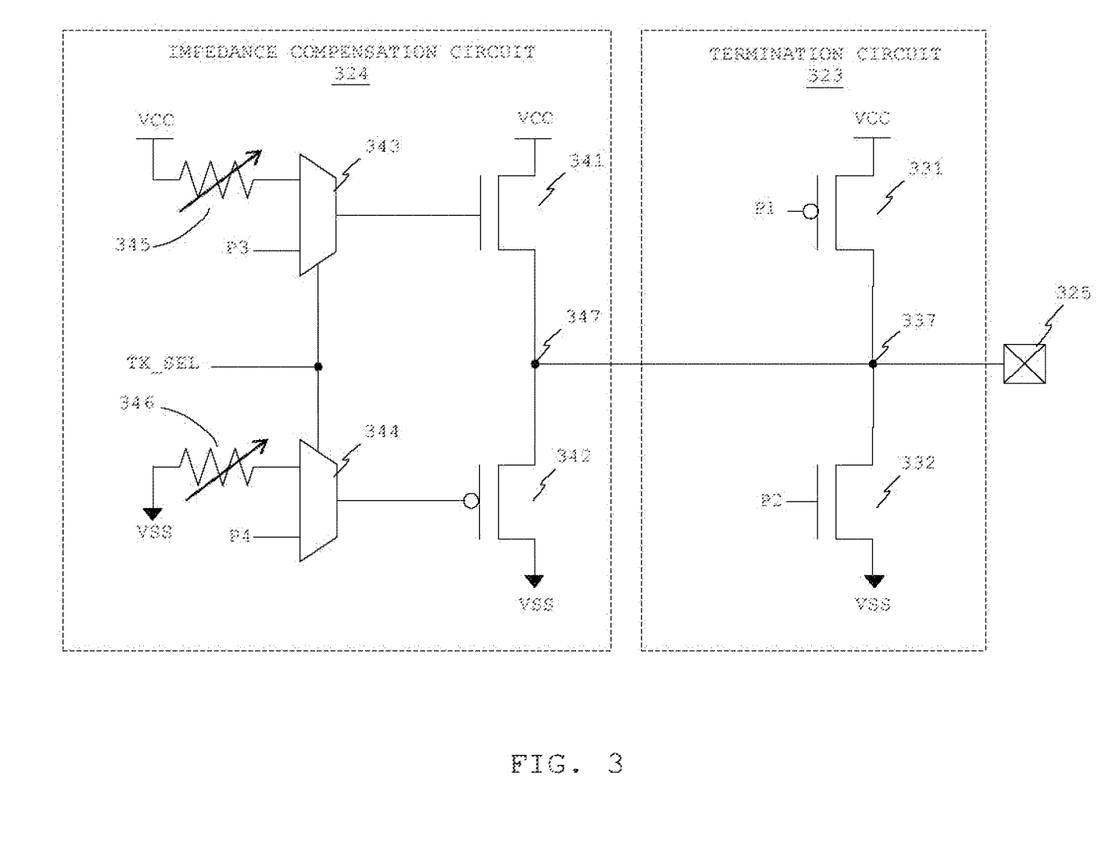
FIG. 3 shows a detailed implementation of an illustrative termination circuit and an impedance compensation circuit in accordance with one embodiment of the present invention.

FIG. 3, meant to be illustrative and not limiting, illustrates a detailed implementation of a termination circuit and an impedance compensation circuit in accordance with one embodiment of the present invention. In one embodiment, termination circuit 323 and impedance compensation circuit 324 may be similar to termination circuit 223 and impedance compensation circuit 224, respectively, of FIG. 2.

As shown in the embodiment of FIG. 3, termination circuit 323 may include p-channel transistor 331, n-channel transistor 332 and a node 337. Transistors 331 and 332 and node 336 may be arranged serially.

In one embodiment, transistors 331 and 332 may be fin field effect transistor (FinFET) structures. FinFET structures may include non-planar transistor channel and source-drain structures disposed on an integrated circuit substrate. Using photolithography and associated etching processes that produce circuit structures in conjunction with a base layer mask, doped regions serving as the source-drain regions and the channel region for a transistor may be formed on the substrate (i.e., may be formed as raised structures above the substrate). A non-planar gate structure may be formed over the channel region of one or more of the doped regions such that the gate structure contacts the entire raised surface of the channel region of the doped region. Generally, FinFETs or other non-planar transistor structures may be used for transistors in the termination circuit 323 without significantly reducing the effective bandwidth of the I/O circuitry due to the inclusion of the impedance compensation circuit 324.

In an alternative embodiment, transistors 331 and 332 may be planar complementary metal oxide semiconductor (CMOS) structures.

Gate terminals of p-channel transistor 331 and re-channel transistor 332 may receive signals P1 and P2. With respect to p-channel transistor 331, one of the source-drain terminals is coupled to a power terminal (VCC) and the other source-drain terminal is coupled to node 227. With respect to n-channel transistor 332, one of the source-drain terminals is coupled to node 227 and another of the source-drain terminals is coupled to a ground terminal (VSS).

When the I/O circuit is configured to be in a receiver mode (i.e., to receive signal) and the incoming signals are having low frequencies (e.g., frequencies less than 600 MHz), transistors 331 and 332 may provide input impedances of 50 Ohms at input-output terminal 325 and/or node 337. Each transistor 331 or 332, however, may have individual impedances of approximately 100 Ohms.

However, transistors 331 and 332 may provide input impedances of less than 50 Ohms at input-output terminal 325 and/or node 337 when I/O circuit receives signals that are having high frequencies (e.g., frequencies more than 600 MHz). This is because the incoming signals having high frequencies may pass through a parasitic capacitor (not shown) formed between input-output terminal 325 and the ground terminal and bypasses p-channel transistor 331 and re-channel transistor 332. Therefore, the incoming signals may see a drop in input impedances that is seen by an incoming signal through input-output terminal 325/terminal node 337. In one embodiment, the input impedances behavior on input-output terminal 325 may be similar to a negative linear function that include incoming signal frequency as one of its variables.

Referring still to FIG. 3, impedance compensation circuit 324 may include n-channel transistor 341, p-channel transistor 342, node 347, multiplexers 343 and 344, variable resistors 345 and 346. The n-channel transistor 341, p-channel transistor 342 and node 347 may be arranged serially between the power terminal VCC and the ground terminal Vss. Furthermore, node 347 may be coupled to node 337.

Similar to p-channel transistor 331 and n-channel transistor 332, n-channel transistor 341 and p-channel transistor 342 may be FinFET structures. In an alternative embodiment, n-channel transistor 341 and p-channel transistor 342 may be planar CMOS structures.

The gate terminals of n-channel transistor 341 and p-channel transistor 342 may be coupled to output terminals of multiplexers 343 and 344, respectively. One of the source-drain terminals of n-channel transistor 341 may be coupled to the power terminal VCC and another of the source-drain terminal of n-channel transistor 341 may be coupled to terminal node 347. As for p-channel transistor 342, one of the source-drain terminals may be coupled to node 347 and another of the source-drain terminals may be coupled to the ground terminal VSS.

Multiplexer 343 may have one of its input terminals coupled to variable resistor 345. The other input terminal of multiplexer 343 may receive a signal P3. In one embodiment, variable resistor 345 may have variable resistances ($R_n$). The resistances $R_n$ of variable resistor 345 may be configured through user inputs. The other end of variable resistor 345 may be further coupled to the power terminal VCC.

Multiplexer 344 may have one of its input terminals coupled to variable resistor 346. The other input terminal of multiplexer 343 may receive a signal P4. In one embodiment, variable resistor 346 may have variable resistances ($R_p$). Similar to variable resistor 345, the variable resistances $R_p$ of variable resistor 346 may be configured through the user inputs. The other end of variable resistor 346 may be further coupled to the ground terminal VSS.

The variable resistances $R_p$ and $R_n$ may be configured so that impedance compensation circuit 324 may start to compensate a drop in input impedances at node 337 once the incoming signals frequency is greater than a particular frequency value. In one embodiment, the variable resistances Rp and Rn may be configured to start compensating the drop in input impedances once the incoming signals frequency is greater than 600 MHz.

Multiplexers 343 and 344 may be controlled by a control signal TX_SEL. In one embodiment, multiplexer 343 and 344 may be selected to connect variable resistors 345 and 346, respectively, to the corresponding gate terminals of n-channel transistor 341 and p-channel transistor 342 when the I/O circuit is configured to be in a receiver mode. In an alternative embodiment, multiplexer 343 and 344 may be selected to transmit signals P3 and P4, respectively, to the corresponding gate terminals of n-channel transistor 341 and p-channel transistor 342 when the I/O circuit is configured to be in a transmitter mode.

Referring still to FIG. 3, termination circuit 323 may provide a constant impedance value (e.g., 50 Ohms) and impedance compensation circuit 324 may be electrically disconnected when the signals received at input-output terminal 325 are of low frequencies (e.g., frequency less than frequency f1). Impedance compensation circuit 324 may be electrically disconnected because capacitances formed between the gate terminals and source terminals of transistors 341 and 342 prevents the incoming signals from observing resistances offered by variable resistors 345 and 346. Nevertheless, the incoming signals may still see input impedances provided by termination circuit 323 (which may amount to 50 Ohms) and hence may enable the incoming signal to be received in to the I/O circuit seamlessly (i.e., a low/non-existent signal RL).

Termination circuit 223 may provide input impedances that are lower than the mentioned constant impedance values when the signals received at input-output terminal 325 are of high frequencies (e.g., frequency greater than frequency f1). However, impedance compensation circuit 324 may compensate the amount of input impedances that dropped by electrically connecting gate terminals of transistors 341 and 342 to their respective variable resistors 345 and 346. Furthermore, the incoming signals of high frequencies may bypass the capacitances formed between the gate terminals and source terminals of transistors 341 and 342.

Figure 4A:
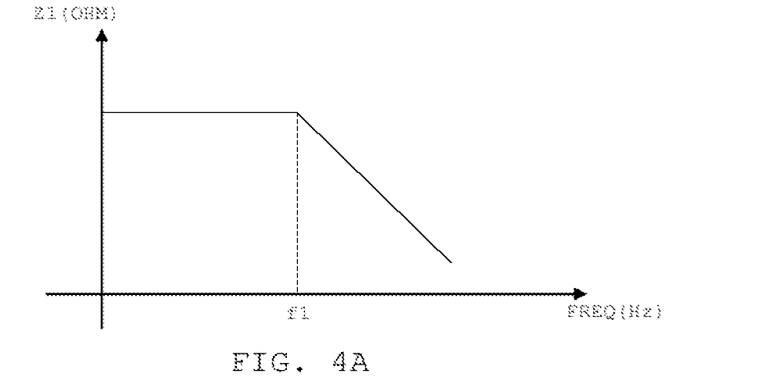
FIG. 4A shows a plot of input impedances at an I/O pad (i.e., Z1) provided by a termination circuit to incoming signals of varied frequencies in accordance with one embodiment of the present invention.

FIG. 4A, meant to be illustrative and not limiting, illustrates a plot on input impedances at an I/O pad (i.e., Z1) provided only by a termination circuit to incoming signals of varied frequencies in accordance with one embodiment of the present invention. In one embodiment, the input-output terminal may be similar to input-output terminal 225 of FIG. 2 or input-output terminal 325 of FIG. 3 and the termination circuit may be similar to termination circuit 223 of FIG. 2 or termination circuit 323 of FIG. 3. The input impedances may be input impedances observed by the incoming signals at the input-output terminal or at a node (e.g., node 227 of FIG. 2 or node 337 of FIG. 3).

As shown in the embodiment of FIG. 4A, the input impedances are relatively constant for incoming signals of low frequencies. In one embodiment, the constant input impedances may be at 50 Ohms. However, the input impedances may drop when the incoming signals frequencies may be greater than the frequency f1. As shown in the embodiment of FIG. 4A, the input impedances drops according to a negative linear function, which has one of its variable as incoming signals frequency. In one embodiment, the frequency f1 may be 600 MHz.

Figure 4B:
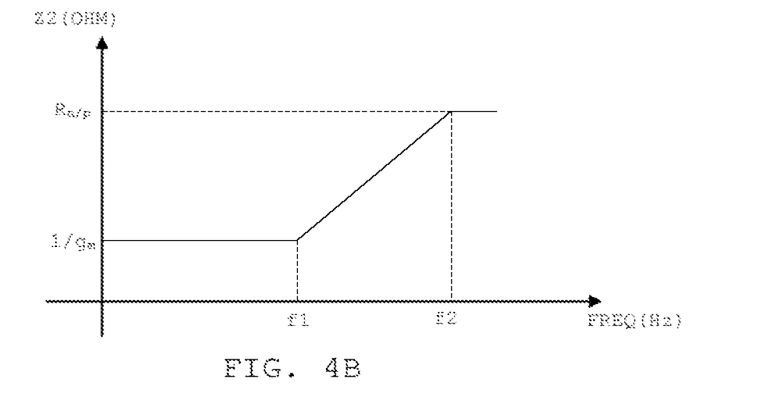
FIG. 4B shows a plot of input impedances at an I/O pad (i.e., Z2) provided by an impedance compensation circuit to incoming signals of varied frequencies in accordance with one embodiment of the present invention.

FIG. 4B, meant to be illustrative and not limiting, illustrates a plot on input impedances at an input-output terminal (i.e., Z2) provided only by an impedance compensation circuit to incoming signals of varied frequencies in accordance with one embodiment of the present invention. In one embodiment, the impedance compensation circuit may be similar to impedance compensation circuit 224 of FIG. 2 or impedance compensation circuit 324 of FIG. 3. Similar to FIG. 4A, the input impedances may be input impedances observed by the incoming signals at the input-output terminal (e.g., input-output terminal 225 of FIG. 2 or input-output terminal 325 of FIG. 3) or at a node (e.g., node 227 of FIG. 2 or node 337 of FIG. 3).

As shown in the embodiment of FIG. 4B, the input impedances provided by the impedance compensation circuit for incoming signals at low frequencies (i.e., frequencies less than f1) are relatively constant. The input impedances may be approximately ~1/gm, whereby gm is signal transconductances at the I/O pad, in one embodiment. In one exemplary embodiment, the input impedances provided by the impedance compensation circuit for frequencies less than f1 may be approximately ~0 Ohm.

Referring still to FIG. 4B, the input impedances provided by the impedance compensation circuit for incoming signals between frequencies f1 and f2 may be similar to a linear function with one of its variable being frequency of the incoming signals. In one embodiment, the impedance compensation circuit may adjust its frequency f1 to coincide with frequency f1 of FIG. 4A by adjusting resistances Rn and Rp for the respective variable resistors (e.g., variable resistors 345 and 346 of FIG. 3). In one embodiment, the frequency f1 may be 600 MHz.

It should be appreciated that the frequency f1 can be set by adjusting Rn or Rp as:

$$f1 = \frac{1}{R_{n/p} * C_{gs}}$$

f1=frequency value at which the impedance compensation circuit starts compensate a drop in input impedances;

$R_{n/p}$=resistances provided to a gate terminal of an n-channel transistor or a p-channel transistor; and $C_{gs}$=capacitances across gate and source terminals of the n-channel transistor or the p-channel transistor.

Therefore, by adjusting the variable resistances $R_n$ and/or $R_p$ of the variable resistors, one may adjust when an impedance compensation circuit may start to compensate the drop in input impedances.

Referring still to FIG. 4B, the input impedances provided by the impedance compensation circuit for signals having frequencies greater than f2 may be a constant value. In one embodiment, the input impedances for signals having frequencies greater than f2 may be similar to the either resistance $R_n$ or $R_p$ as provided by their respective variable resistors.

Figure 4C:
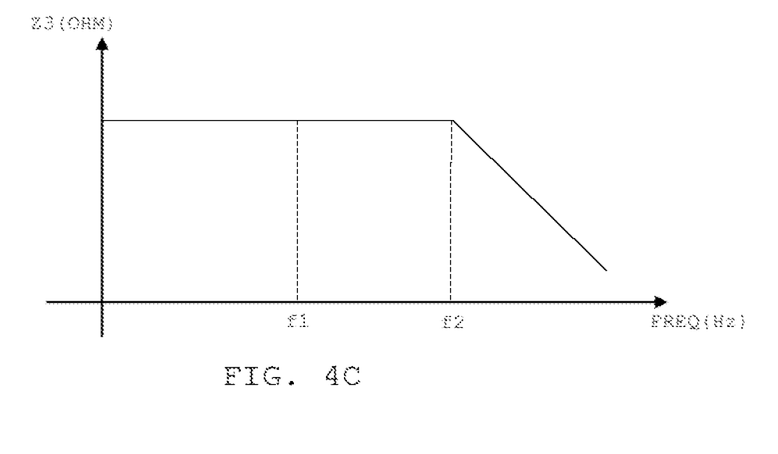
FIG. 4C shows a plot of input impedances at an I/I/O PADO pad (i.e., Z3) provided by combined impedance compensation circuit and a termination circuit to incoming signals of varied frequencies in accordance with one embodiment of the present invention.

FIG. 4C, meant to be illustrative and not limiting, illustrates a plot on input impedances at an input-output terminal (i.e., Z3) provided by combined impedance compensation circuit and a termination circuit to incoming signals of varied frequencies in accordance with one embodiment of the present invention. In one embodiment, the plot on input impedances Z3 may be a cumulative plot of input impedances Z1 and Z2 (i.e., a sum of the input impedances Z1 and Z2 illustrated in FIGS. 4A and 4B over the frequency range).

Similar to FIGS. 4A and 4B, the termination circuit may be similar to termination circuit 223 of FIG. 2 or termination circuit 324 of FIG. 3, the impedance compensation circuit may be similar to impedance compensation circuit 224 of FIG. 2 or impedance compensation circuit 324 of FIG. 3. Similar to FIGS. 4A and 4B, the input impedances may be input impedances observed by the incoming signals at the input-output terminal (e.g., input-output terminal 225 of FIG. 2 or input-output terminal 325 of FIG. 3) or at a node (e.g., node 227 of FIG. 2 or node 337 of FIG. 3).

As shown in the embodiment of FIG. 4C, the input impedances are relatively constant for the incoming signals that has frequencies of less than frequency f2. In one embodiment, the constant input impedances may be at 50 Ohms. As shown in the plots Z1 and Z2, the circuit that provides input impedances at the input-output terminal for frequency less than f1 is the termination circuit (the impedance compensation circuit may be electrically disconnected). Subsequently, as shown in the plots Z1 and Z2, the circuit that provides input impedances at the input-output terminal for frequencies greater than f1 but less than f2 is the termination circuit and the impedance compensation circuit, whereby each providing a component of input impedances. However, input impedances provided by the termination circuit decreases and the input impedances provided by the impedance compensation circuit increases as the incoming signals frequency increases.

However, the input impedances drop in accordance to a negative linear function when the incoming signals frequency is greater than the frequency f2. In one embodiment, the frequency f2 may be 1600 MHz.

Figure 5:
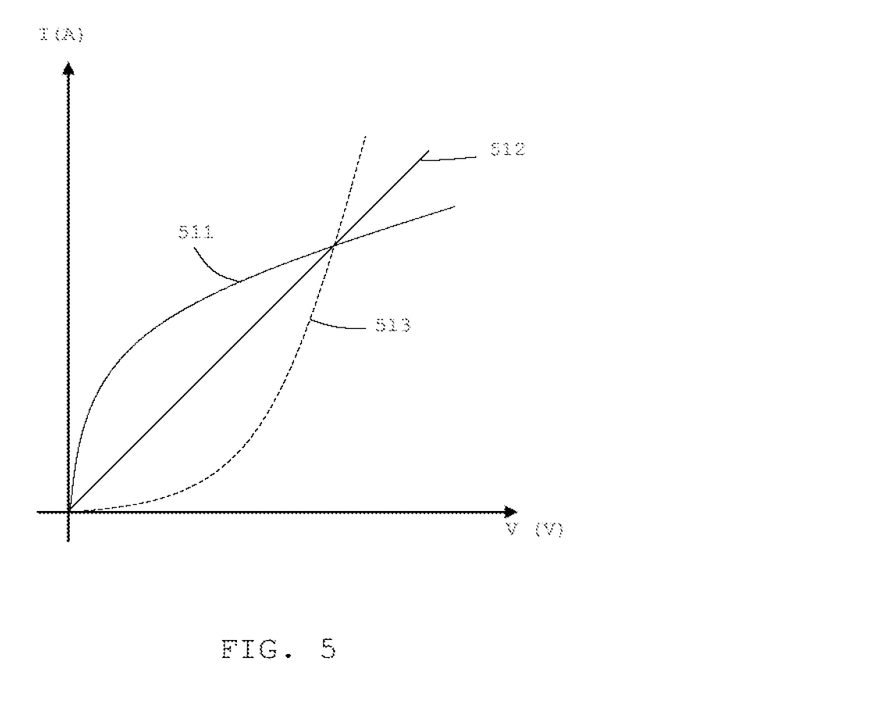
FIG. 5 shows three electrical current plots across different branches of I/O circuit at different I/O pad voltage levels in accordance with one embodiment of the present invention.

FIG. 5, meant to be illustrative and not limiting, illustrates three electrical current plots across different branches of I/O circuit at different input-output terminal voltage levels in accordance with one embodiment of the present invention. In one embodiment, I/O circuit may be similar to I/O circuit 120 of FIG. 1 or I/O circuit 220 of FIG. 2 and the input-output terminal may be similar to input-output terminal 225 of FIG. 2 or input-output terminal 325 of FIG. 3.

Electrical current plot 511 is a plot of electrical that goes through a termination circuit. In one embodiment, the termination circuit may be similar to termination circuit 323 of FIG. 3. As shown by electrical current plot 511, the electrical current reaches saturation once the input-output terminal increases up a certain voltage level. The curve of electrical current plot 511 may be a power function with a power less than one (i.e., a function relating the current I and the voltage V having the form $I(V)=V^k$, where k is a constant less than 1). The curve of electrical current plot 511 may alternatively be a logarithmic function (i.e., a function relating the current I and the voltage V having the form of $I(V)=\log_m(V)$, where k is a positive real number). The curve of electrical current plot 511 may be said to have a decreasing rate of change because the first derivative of the current plot 511 monotonically decreases for all non-zero voltage values.

Electrical current plot 513 is a plot of electrical that goes through an impedance compensation circuit. In one embodiment, the impedance compensation circuit may be similar to impedance compensation circuit 324 of FIG. 3. As shown by electrical current plot 513, the electrical current may be similar to propagating similar to propagating through a diode. The curve of electrical current 513 may be an exponential function (i.e., a function relating the current I and the voltage V having the form of $I(V)=m^v$, where m is a positive real number). The curve of electrical current 513 may alternatively be a power function with a power greater than one (i.e., a function relating the current I and the voltage V having the form $I(V)=V^j$, where j is a constant greater than 1 such as 1/k, where k is a constant less than 1). The curve of electrical current plot 513 may be said to have an increasing rate of change because the first derivative of the current plot 511 monotonically increases for all non-zero voltage values.

Electrical current plot 512 is a combined plot of electrical current that goes through an input-output terminal. In other words, the current plot 512 is the function of curve 511 applied to the function of curve 513. As shown by electrical current plot 512, the electrical current may be a linear function to the voltage applied at the input-output terminal. This is because the termination circuit and the impedance compensation circuit compensate the electrical current so that the electrical current increases linearly to the voltages applied at the input-output terminal.

Figure 6:
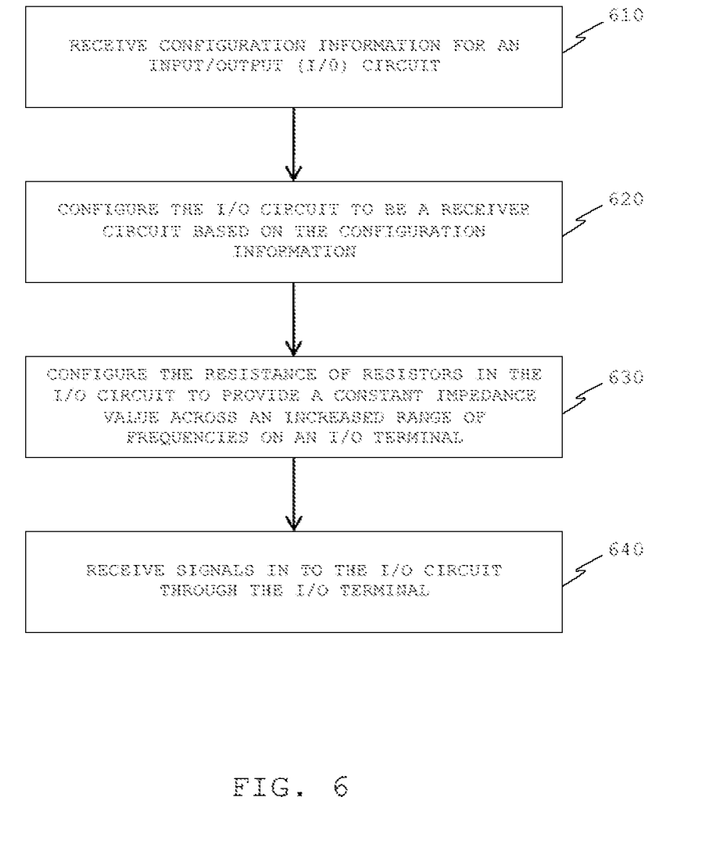
FIG. 6 shows a flowchart of an illustrative method to operate the input/output (I/O) circuit in accordance with one embodiment of the present invention.

FIG. 6, meant to be illustrative and not limiting, illustrates a flowchart of a method to operate the input/output (I/O) circuit in accordance with one embodiment of the present invention. The I/O circuit may be similar to I/O circuit 120 of FIG. 1 or I/O circuit 220 of FIG. 2. In addition to that, the I/O circuit may include a termination circuit (e.g., termination circuit 223 of FIG. 2 or termination circuit 323 of FIG. 3) and an impedance compensation circuit (e.g., impedance compensation circuit 224 of FIG. 2 or termination circuit 324 of FIG. 3).

At step 610, configuration information for the I/O circuit is received. In one embodiment, the configuration information may include information on whether to configure the I/O circuit to be in a receiver mode or a transmitter mode (i.e., by programming TX_SEL signal of FIG. 3). In addition to that, the configuration information may include information to program resistances of variable resistors (e.g., variable resistors 345 and 346) in the impedance compensation circuit.

At step 620, the I/O circuit is configured to be in the receiver mode. In one embodiment, the I/O circuit is configured to be in the receiver mode by transmitting a logic low signal (i.e., logic signal of '0') as the TX_SEL signal. As a result of that, the variable resistors may be directly coupled to gate terminals of the respective transistors.

At step 630, the resistances of the variable resistors are configured to provide constant impedances across an increased range of frequencies (as shown in the FIG. 4C). In one embodiment, such constant impedance may be provided by the termination circuit and the impedance compensation circuit. The termination circuit provides a substantially constant output impedances up till a frequency f1 and a linearly dropping output impedances after the frequency f1 (as shown in the FIG. 4A). The impedance compensation circuit, one the other hand, compensates an output impendences drop from the constant output impedances to the linearly dropping output impedances between the frequency f1 and a frequency f2 (as shown in the FIG. 4B).

At step 640, the signals are received through input-output terminal. As the output impedances are constant across a broad range of frequencies, the signals may be received seamlessly. In one embodiment, the signals may be in accordance to the DDR SDRAM, DDR2 SDRAM, DDR3 SRAM and DDR4 SRAM transmission protocols.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; I/O circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An input/output (I/O) circuit for an integrated circuit, comprising:
an input-output terminal;
a termination circuit having a node that is coupled to the input-output terminal, wherein the termination circuit exhibits a substantially constant first impedance below a first frequency of signals received at the input-output terminal, and wherein the termination circuit exhibits a second impedance that is less than the first impedance when signals having a second frequency that is higher than the first frequency are received at the input-output terminal; and
an impedance compensation circuit that is coupled to the input-output terminal, wherein the impedance compensation circuit compensates for differences between the first and second impendences when the signal having the second frequency is received at the input-output terminal, wherein the impedance compensation circuit comprises:
a n-channel transistor;
a first multiplexer circuit having an output terminal coupled to a gate terminal of the n-channel transistor;
a p-channel transistor that is coupled in series to the n-channel transistor;
a second multiplexer circuit having an output terminal coupled to a gate terminal of the p-channel transistor;
a first resistor that is coupled to the gate terminal of the n-channel transistor through the first multiplexer circuit; and
a second resistor that is coupled to the gate terminal of the p-channel transistor through the second multiplexer circuit.

2. The I/O circuit as defined in claim 1, wherein the first and second resistors are both variable resistors, the I/O circuit further comprising:
a positive voltage supply terminal; and
a ground voltage supply terminal, and wherein the n-channel transistor and the p-channel transistor are coupled between the positive voltage supply terminal and the ground voltage supply terminal.

3. The I/O circuit as defined in claim 1, wherein the respective resistances of the first and second resistors are both greater than 50 Ohms.

4. The I/O circuit as defined in claim 1, wherein the first multiplexer couples the first resistor to the n-channel transistor when the I/O circuit is in a receiver mode, and wherein the second multiplexer couples the second resistor to the p-channel transistor when the I/O circuit is in the receiver mode.

5. The I/O circuit as defined in claim 1, wherein the first multiplexer is selectable to couple an input terminal other than input terminal coupled to the first resistor to the n-channel transistor, and wherein the second multiplexer is selectable to couple an input terminal other than input terminal coupled to the second resistor to the p-channel transistor when the I/O circuit is in a transmitter mode.

6. The I/O circuit as defined in claim 1, wherein resistances of the first and second resistors are configured to compensate differences between the first and second impedances when the signal having the second frequency that is higher than the first frequency are received at the input-output terminal.

7. The I/O circuit as defined in claim 1, wherein the termination circuit comprises:
a p-channel transistor having a source-drain terminal coupled to a voltage supply terminal and another source-drain terminal coupled to the node; and
a n-channel transistor having a source-drain terminal coupled to the node and another source-drain terminal coupled to a ground terminal.

8. The I/O circuit as defined in claim 7, wherein impedance values of the p-channel transistor and the re-channel transistor are both 100 Ohms when the signal having the second frequency that is higher than the first frequency are received at the input-output terminal.

9. An integrated circuit device, comprising:
a plurality of input/output (I/O) circuits, wherein each I/O circuit comprises:
a termination circuit that provides a substantially constant first impedance within a first signal bandwidth and a second impedance outside of the first signal bandwidth for the I/O circuit; and
an impedance compensation circuit that is coupled to the termination circuit, wherein the impedance compensation circuit provides a third impedance that is utilized to increase a signal bandwidth for the I/O circuit from the first signal bandwidth to a second signal bandwidth, and wherein the signal bandwidth for the I/O circuit is increased from the first signal bandwidth to the second signal bandwidth by combining the second and third impedances, wherein the sum of the second and third impedances is substantially equal to the first impedance.

10. The integrated circuit device as defined in claim 9, wherein the impedance compensation circuit comprises:
a first transistor; and
a second transistor coupled in series to the first transistor, wherein a gate terminal of the first transistor is coupled to the first resistor, and wherein a gate terminal of the second transistor is coupled to the second resistor.

11. The integrated circuit device as defined in claim 10, wherein the first and second transistors are electrically disconnected when a signal received is having a frequency that is less than the first cutoff frequency value, and the first and second transistors are electrically connected when a signal received is having a frequency that is greater than the first cutoff frequency value.

12. The integrated circuit device as defined in claim 10, wherein first and second resistors are variable resistors.

13. An input/output (I/O) circuit, comprising:
an input-output terminal;
a termination circuit having a node that is coupled to the input-output terminal, wherein the termination circuit that passes an electrical current with a decreasing rate of change with increasing voltage of the signals received at the input-output terminal; and
an impedance compensation circuit that is coupled to the node of the termination circuit, wherein the impedance compensation circuit transmits an electrical current with an increasing rate of change with increasing voltage of the signals at the input-output terminal, wherein the impedance compensation circuit comprises:
a n-channel transistor;
a first multiplexer circuit having an output terminal coupled to a gate terminal of the n-channel transistor;
a p-channel transistor that is coupled in series to the n-channel transistor;
a second multiplexer circuit having an output terminal coupled to a gate terminal of the p-channel transistor;

a first resistor that is coupled to the gate terminal of the n-channel transistor through the first multiplexer circuit; and a second resistor that is coupled to the gate terminal of the p-channel transistor through the second multiplexer circuit.

14. The I/O circuit as defined in claim 13, wherein the input-output terminal transmits an electrical current that increases substantially linearly as the voltage levels at the input-output terminal increases.

15. The I/O circuit as defined in claim 13 is a first I/O circuit of a plurality of I/O circuits.

* * * * *